(12) United States Patent
Schnetter

(10) Patent No.: US 10,676,400 B2
(45) Date of Patent: Jun. 9, 2020

(54) CERAMICS WRINGING

(71) Applicant: CeramTec-ETEC GmbH, Lohmar (DE)

(72) Inventor: Lars Schnetter, Wimbach (DE)

(73) Assignee: CeramTec-ETEC GmbH, Lohmar (DE)

(*) Notice: Subject to any disclaimer, the term of this patent is extended or adjusted under 35 U.S.C. 154(b) by 638 days.

(21) Appl. No.: 15/319,158

(22) PCT Filed: May 21, 2015

(86) PCT No.: PCT/EP2015/001030
§ 371 (c)(1),
(2) Date: Apr. 24, 2017

(87) PCT Pub. No.: WO2015/176816
PCT Pub. Date: Nov. 26, 2015

(65) Prior Publication Data
US 2017/0226019 A1    Aug. 10, 2017

(30) Foreign Application Priority Data

May 21, 2014    (DE) .................. 10 2014 007 369

(51) Int. Cl.
| | | |
|---|---|---|
| C04B 37/00 | (2006.01) |
| C04B 35/645 | (2006.01) |
| F24C 15/00 | (2006.01) |
| F24C 15/04 | (2006.01) |
| F24B 13/00 | (2006.01) |
| C04B 37/04 | (2006.01) |
| C23C 14/06 | (2006.01) |
| C23C 16/22 | (2006.01) |
| H04M 1/02 | (2006.01) |

(52) U.S. Cl.
CPC ........ *C04B 37/001* (2013.01); *C04B 35/6455* (2013.01); *C04B 37/005* (2013.01); *C04B 37/006* (2013.01); *C04B 37/04* (2013.01); *C04B 37/042* (2013.01); *C04B 37/045* (2013.01); *C23C 14/06* (2013.01); *C23C 16/22* (2013.01); *F24B 13/004* (2013.01); *F24C 15/004* (2013.01); *F24C 15/04* (2013.01); *B32B 2307/42* (2013.01); *B32B 2307/704* (2013.01); *B32B 2315/02* (2013.01); *B32B 2457/20* (2013.01); *C04B 2235/6581* (2013.01); *C04B 2235/666* (2013.01); *C04B 2235/963* (2013.01); *C04B 2235/9607* (2013.01); *C04B 2235/9646* (2013.01); *C04B 2235/9653* (2013.01); *C04B 2237/10* (2013.01); *C04B 2237/30* (2013.01); *C04B 2237/343* (2013.01); *C04B 2237/52* (2013.01); *C04B 2237/55* (2013.01); *C04B 2237/555* (2013.01); *C04B 2237/60* (2013.01); *C04B 2237/70* (2013.01); *C04B 2237/704* (2013.01); *H04M 1/0266* (2013.01)

(58) Field of Classification Search
None
See application file for complete search history.

(56) References Cited

U.S. PATENT DOCUMENTS

| | | | |
|---|---|---|---|
| 2005/0215028 A1 | 9/2005 | Wei et al. |
| 2007/0087204 A1 | 4/2007 | Bayya et al. |
| 2009/0294017 A1 | 12/2009 | Traggis et al. |
| 2009/0294050 A1 | 12/2009 | Traggis et al. |
| 2010/0139840 A1 | 6/2010 | Allemand |
| 2012/0196105 A1 | 8/2012 | Sanghera et al. |
| 2013/0164509 A1 | 6/2013 | Siebers et al. |
| 2014/0083597 A1 | 3/2014 | Kalkowski et al. |
| 2014/0360345 A1 | 12/2014 | Schnetter et al. |

FOREIGN PATENT DOCUMENTS

| | | |
|---|---|---|
| DE | 102010032113 A1 | 1/2012 |
| WO | 2012/113787 A1 | 8/2012 |
| WO | 2013/068418 A1 | 5/2013 |

OTHER PUBLICATIONS

International Critical Tables of Numerical Data, Physics, Chemistry and Technology; Physical Properties of Inorganic Compounds (B-Table), Copyright 2003. https://app.knovel.com/hotlink/itble/rcid:kpICTNDPC4/id:kt00BTECEB/international-critical/physical-properties-inorganic).*
Olivier Guillon et al: "Field-Assisted Sintering Technology/Spark Plasma Sintering: Mechanisms, Materials, and Technology Developments FAST/SPS: Mechanisms, Materials, and Technology Developments", Advanced Engineering Materials., Bd. 16, Nr. 7, Apr. 30, 2014, Seiten 830-849, XP055400122.
Office Action of EP Appln. No. 15 730 055.9-1101 dated Mar. 2, 2018.
International Search Report for PCT/EP2015/001030 dated Dec. 3, 2015; English translation submitted herewith (13 pages).
Haisma J, et al.: "Contact bonding, including direct-bonding in a historical and recent context of materials science and technology, physics and chemistry—Historical review in a broader scope and comparative outlook", Materials Science and Engineering R 37, Reports: A Review Journal. Elsevier Science B.V, vol. 37, No. 1-2, Apr. 5, 2002, pp. 1-60.

* cited by examiner

*Primary Examiner* — Laura C Powers
(74) *Attorney, Agent, or Firm* — Fitch, Even, Tabin & Flannery, LLP

(57) ABSTRACT

The object of the present invention is an integrally bonded composite component, a method for the production thereof, and the use thereof. The invention particularly relates to integrally bonded transparent ceramic composite components, to a method for the production of such ceramic composite components, and to the use thereof.

25 Claims, No Drawings

CERAMICS WRINGING

CROSS-REFERENCE TO RELATED APPLICATIONS

This application is a U.S. national phase application filed under 35 U.S.C. § 371 of International Application No. PCT/EP2015/001030, filed May 21, 2015, designating the United States, which claims priority from German Patent Application No. 10 2014 007 369.6, filed May 21, 2014, which are hereby incorporated herein by reference in their entirety for all purposes.

The object of the present invention is an integrally bonded composite component, a method for the production thereof, and the use thereof. The invention particularly relates to integrally bonded transparent ceramic composite components, to a method for the production of such ceramic composite components, and to the use thereof.

Technical ceramic has the advantage over many other materials of being chemically, thermally and/or mechanically more stable. For this reason, it would be advantageous if the uses of ceramics could be expanded.

Transparent ceramics in particular can have advantages over other transparent materials, such as plastics or glasses, in high-performance applications. Their high level of chemical, thermal and mechanical resistance makes them ideal for applications with extreme stress.

However, technical ceramics also have disadvantages. For example, the breaking strength of thin ceramic substrates is not sufficient for many applications. A transparent ceramic could be used, for example, as a scratch resistant display screen for mobile electronic devices. However, the required standards pertaining to thickness and weight are difficult to achieve with ceramic panels, since they require a certain thickness to ensure sufficient breaking strength.

One way to solve this problem is to utilize ceramic substrate composites or laminates in which the ceramic can be made very thin, and acts as the functional surface. The substrate serves as a support for the ceramic and can enable other functions, such as giving the composite sufficient breaking strength. However, the ceramic and the support material must be strongly—preferably integrally—bonded to each other.

Ceramic/substrate laminates which are bonded to each other by means of an adhesive layer are known from the prior art. However, such an adhesive layer is disadvantageous, especially if the highest possible strength of the overall laminate is sought in connection with extreme layer adhesion.

Integrally bonded composites of amorphous materials such as glass, produced by means of wringing of two individual components, are particularly known in the field of optics. This involves making a bond between two components which have very high surface quality and are designed to match with a form fit. With such components, the corresponding surfaces are able to establish such a tight fit with each other, upon contact, that a permanent bond is created between the two components. The force which maintains this bond is believed to arise from the van der Waals forces between individual atoms or molecules of the two components.

The advantage of wringing is that the bond of the components arises without the use of a bonding material, such as an adhesive, for example. It is assumed that the components substantially hold together because of adhesion forces. The joining mechanism of silicon and quartz wafers is based on Si—O—Si bonds which are formed at elevated temperatures (>100° C.) (Gösele, Tong: *Semiconductor Wafer Bonding, Annual Review of Materials Science* 28 (1), 1998, 215-241). It is assumed that the surface must be sufficiently hydrophilized in order to form the Si—O—Si bonds. Clean, extremely smooth, and precisely fitting surfaces are required for the bond to last.

DE102011012835 A1 describes a method for joining glasses and crystalline ceramics by means of a pretreatment in a low-pressure oxygen plasma, followed by a heat treatment under vacuum (<10 mbar) at at least 100° C. No additional coating methods (for example, with $SiO_2$) are required. This is possible due to the use of high contact pressures, in the range from 20 kPa to 5 MPa.

The problem addressed by the present invention is that of providing a strong bond between a technical ceramic and another component. Particularly in the case of transparent ceramics, the bond according to the invention should also have no negative effect on the transparency of the composite. According to the invention, a composite component is made of ceramic and ceramic, or ceramic and other materials—that is, for example, ceramic and (hardened) glass or ceramic and plastic.

The invention has made possible, for the first time, the production by wringing of transparent material composites with at least one ceramic component, based on the development of polycrystalline transparent ceramics such as those described in WO 2013/068418 A1, with RIT values >75% at 600 nm wavelength (thickness: 2 mm). The transparency must be appropriately quantified by measuring
- real inline transmission (RIT) with a narrow aperture angle of <0.5°
- spot frequency
- haze.

The problem addressed by the invention is solved by a composite component with the features of the main claim. Preferred embodiments are disclosed in the dependent claims. The inventive method for the production of the composite component according to the invention is characterized by the features of the independent method claim. Accordingly, the inventive method provides a bond between a ceramic component and another component, by wringing the same. Preferred embodiments of the inventive method can be found in the dependent method claims.

According to a preferred embodiment of the invention, the two components are directly joined to each other—that is, without a bonding agent. A joining pressure is required for this purpose.

However, according to another embodiment of the invention, it is likewise possible to apply a bonding agent to one or both components and then to wring the components via the bonding agent(s). The bonding agents according to the invention are particularly preferably metals or metal oxides which can be applied using a wide variety of procedures to the individual components. In this case, coating methods are particularly preferred, specifically PVD methods (e.g., sputtering, electron-beam evaporation, ion-assisted deposition), CVD methods, or sol-gel methods. PVD methods have proven particularly suitable, since it is possible to achieve the surface evenness required for the wringing. The layer thicknesses are preferably in the range of 1 nm to 10 μm. Of course, the layers can also be applied to the components by screen printing or pad printing, or similar methods.

The metals can be incorporated as metal layers or as oxide layers. Oxide layers can preferably also only arise once the components are joined—for example if the joining is performed under oxidizing conditions, for example in an oxidizing atmosphere.

Si and Ti, particularly preferably $SiO_2$, $TiO_2$ or ITO (indium tin oxide), which are transparent, are preferably used as the bonding agent. Other metals or metal oxides, in particular those which are transparent, are also suitable as bonding agents according to the invention. For components which do not need to be transparent, of course non-transparent metals or metal oxides can be used. An alternative method is surface silicatization by means of flame pyrolysis deposition of a silicon precursor. In this case, the surface is coated with $SiO_2$ by burning monosilane ($SiH_4$). A pre-cleaning of the surface is particularly preferred in this case (e.g. by plasma cleaning).

To make it possible to wring the components, the surfaces which will be wrung should have an evenness of <10 µm, preferably <1 µm, and more preferably <100 nm.

According to the invention, the distance between the surfaces of the components to be bonded is very small during the joining process. According to the invention, it is particularly preferred that the surfaces of the components to be joined are brought into intimate contact—that is, the distance between the surfaces is equal to zero according to the invention, and the surfaces of the components to be joined contact each other over the greatest possible portion of their surfaces. In order to ensure this intimate contact, the evenness of the surfaces described above is particularly preferred according to the invention. Moreover, it is preferred according to the invention that the surfaces to be bonded are designed to precisely fit each other. Particularly if the components are to be wrung without bonding agents, there must be extremely high demands for the precision fit.

After or during the joining process, an application of pressure and/or heat may be necessary according to the invention, depending on which materials are to be bonded together.

Pressures which are preferred according to the invention are between atmospheric pressure and 2000 MPa. High pressures can be generated in a hot isostatic press (HIP), by way of example, by gas (argon, nitrogen, air).

The preferred temperature range for the joining process is between room temperature and temperatures below the melting/softening temperature of the component with the lower melting/softening temperature.

If the joining process according to the invention is carried out in an HIP system, this offers the advantage that it is possible to apply heat and pressure—even in a certain atmosphere, if necessary—at the same time.

Moreover, a treatment can be performed in a vacuum furnace, in a pressure sintering furnace, or in other units which allow a treatment with pressure and/or heat. Moreover, it is possible in an oven to use a mechanical press component—that is, a press, for example—followed by heat treatment.

To shorten the process times according to the invention, the pressure and temperature treatment can be performed by means of rapid sintering technology such as the FAST method (Field Assisted Sintering Technology).

Before the wringing of the components, a cleaning of the surfaces to be joined may be expedient. By plasma etching, chemical cleaning, heating in air, in vacuum or in an $H_2$ atmosphere, or by ion milling, the surfaces can be freed according to the invention of water, OH— groups, hydrocarbons and other substances.

According to a preferred embodiment of the invention, the coefficients of thermal expansion (CTE) of the components to be wrung can be matched to each other. For certain applications, for example if the composite component produced according to the invention will be subjected to thermal stress when used—for example as a furnace or chimney window—it is advantageous if the CTEs are as similar as possible.

However, there may also be applications for the composite component for which it is advantageous according to the invention if the two components have different coefficients of thermal expansion. If a composite component in which one of the components is made of a material having a higher CTE is produced according to the invention, then a compressive stress is generated in the other component. If, by way of example, a ceramic component with a low CTE is bonded to a glass with a higher CTE, a compressive stress is generated in the ceramic surface which can increase the breaking strength of the ceramic.

According to a particularly preferred embodiment of the invention, the manufactured composite component is a part of a display, for example for a mobile electronic device. In this case it is advantageous if the total thickness of the composite component is as small as possible. The ceramic composite component therefore consists of a thin ceramic layer which has been bonded to a chemically tempered glass or a plastic, for example. For such an application, the ceramic layer and/or the ceramic component has a thickness of <50 mm, preferably a thickness of <1 mm, more preferably a thickness of <0.5 mm, and most particularly preferably a thickness of <0.1 mm.

The underlying principle of the invention is based on the generation of a diffusion layer between the ceramic component and the component material which will be wrung to the same. A minimal penetration into the ceramic surface of the component material being wrung, or a modification of the lattice in the contact layer, is possible.

The bond of the components to be wrung should be integral, forming a chemical reaction zone.

Surprisingly, it has been found that transparent composite components according to the invention can be produced by wringing, without an interfering intermediate layer, with an RIT >60%, preferably >70%, and most preferably >75% spot frequencies <10%, preferably <3% and most preferably <1% haze <10%, preferably 5%, and more preferably <2%.

High demands for evenness (<10 µm, preferably <1 µm, and more preferably <100 nm) and roughness (<20 nm, preferably <10 nm and most preferably <1 nm) make it possible to prevent scattered light—generated, for example, by superficial pores—and interference patterns.

If the joining partners have a thin design (thickness <1.5 mm, preferably <0.75 mm, and more preferably <0.3 mm), it is possible to generate even more suitable bonds, with RIT values >80% because of transparency increases with reduced thickness. The reason for this is that in thinner forms of the ceramic component, the already-small flaw frequency (porosity <100 ppm) is reduced, and light passes through the device with essentially no hindrance. Moreover, the geometrical requirements are lowered, since the glass and ceramic components are deformable and can nestle flexibly against each other. A joining pressure is necessary for this purpose.

The thin ceramic components have a polycrystalline structure. Preferably Mg—Al spinel ($MgAl_2O_4$) or polycrystalline aluminum oxide ($\alpha$-$Al_2O_3$) is used.

If a rigid ceramic is made thin enough, it can be flexible: The flexural rigidity is proportional to the cube of the thickness; a thin component design therefore reduces the stiffness significantly. This is particularly pronounced if the ceramic thickness is about <300 μm, preferably <200 μm and particularly preferably <100 μm.

Specifically, the present invention describes:

a composite component created by a permanent bond of two components, wherein at least one component is a technical ceramic, and wherein the components are bonded without using a bonding material;

a composite component according to the preceding points, wherein the two components are integrally bonded to each other, forming a chemical reaction zone;

a composite component according to one of the preceding points, wherein one of the components is a technical ceramic and the other component is selected from a ceramic, a second technical ceramic, a transparent material, a glass, preferably an alkali aluminum silicate glass, particularly preferably an alkali aluminum silicate glass which is pretensioned under pressure in the layer near the surface, a hardened glass, or a plastic;

a composite component according to one of the preceding points, wherein the technical ceramic has a polycrystalline structure;

a composite component according to one of the preceding claims, characterized in that the technical ceramic is a polycrystalline, transparent technical ceramic;

a composite component according to one of the preceding points, wherein the technical ceramic is a polycrystalline, transparent technical ceramic, preferably Mg—Al spinel ($MgAl_2O_4$) or polycrystalline aluminum oxide ($\alpha$-$Al_2O_3$);

a composite component according to one of the preceding points, which is transparent;

a composite component according to one of the preceding points, wherein it is transparent and has an RIT >60%, preferably >70% and most preferably >75%, spot frequencies <10%, preferably <3% and most preferably <1%, and haze <10%, preferably 5% and most preferably <2%;

a method for producing a composite component according to one or more of the preceding points, wherein two components, of which at least one component is a technical ceramic, are bonded without using a bonding material, by wringing;

the method according to any of the preceding points, wherein two components, of which at least one component is a technical ceramic, are bonded without using a bonding material, by means of a joining pressure;

the method according to any of the preceding points, wherein a bonding agent is applied to the surface of one or both components, and then the components are wrung via the bonding agent(s);

the method according to any of the preceding points, wherein metals or metal oxides are used as the bonding agent;

the method according to any of the preceding points, wherein the bonding agent is applied by means of coating methods, in particular PVD methods (e.g., sputtering, electron-beam evaporation, ion-assisted deposition), CVD methods, or sol-gel methods;

the method according to any of the preceding points, wherein the bonding agent is applied in layer thicknesses of 1 nm to 10 μm;

the method according to any of the preceding points, wherein Si and Ti, more preferably $SiO_2$, $TiO_2$ or ITO (indium tin oxide), which are transparent, are used as the bonding agent;

the method according to any of the preceding points, wherein a surface silicatization is performed by means of flame pyrolysis deposition of a silicon precursor;

the method according to any of the preceding points, wherein the surface is coated with $SiO_2$ by burning monosilane ($SiH_4$);

the method according to any of the preceding points, wherein the surfaces of the components being wrung have an evenness of <10 μm, preferably of <1 μm, and particularly preferably of <100 nm;

the method according to any of the preceding points, wherein the surfaces being joined are formed to precisely fit each other;

the method according to any of the preceding points, wherein pressure and/or heat is applied after or during the joining process;

the method according to any of the preceding points, wherein the applied pressures lie between atmospheric pressure and 2000 MPa;

the method according to any of the preceding points, wherein pressure is applied in a hot isostatic press (HIP) by gas pressure (argon, nitrogen, air);

the method according to any of the preceding points, wherein the temperature range for the joining process is between room temperature and temperatures which are below the melting/softening temperature of the component with the lower melting/softening temperature;

the method according to any of the preceding points, wherein the pressure and/or temperature treatment can be performed by means of rapid sintering technology, such as the FAST method (Field Assisted Sintering Technology), to shorten the process time;

the method according to any of the preceding points, wherein prior to the wringing of the components, the surfaces to be joined are cleaned;

the method according to any of the preceding points, wherein prior to the wringing of the components, the surfaces to be joined are freed of interfering substances by plasma etching, chemical cleaning, heating in air, in vacuum or in an $H_2$ atmosphere, or by ion beam etching;

the method according to any of the preceding points, wherein the coefficients of thermal expansion (CTE) of the components being wrung are matched to each other;

the method according to any of the preceding points, where the coefficients of thermal expansion (CTE) of the components being wrung are as similar as possible;

the method according to any of the preceding points, wherein one component consists of a material with a higher CTE, so as to generate compressive stress in the other component.

Furthermore, the present invention describes the use of the composite component according to the invention, or the composite component produced according to the invention, for example as part of a display, such as for a mobile electronic device, or as an oven or chimney window.

The invention is explained below using examples, although it is not limited to these:

EXAMPLE 1

Two square spinel tiles with polished ($r_a$<20 nm, preferably $r_a$<10 nm and more preferably $r_a$<4 nm) surface are pretreated with chemical agents and plasma cleaning. In a clean room environment, the surfaces are brought into contact at room temperature, aligned, and tempered in a hot isostatic press using isostatic pressure of >500 bar, preferably >1000 bar and more preferably >1500 bar. The necessary temperatures are >1200° C., preferably >1350° C., and more preferably >1500° C. After the heat treatment, an integral bond has formed by diffusion processes which makes possible the transparent composite components with RIT values >75%.

EXAMPLE 2

An alkali aluminum silicate glass which can be pretensioned with pressure in the layer near the surface is wrung with a transparent spinel ceramic. The dimensions of the square samples are 10 mm×10 mm. The glass has a thickness of 1 mm, and the ceramic thickness is 500 µm. The evenness is <5 µm, and the roughness is less than 1 nm. Chamfered edges of both joining surfaces allow a precise alignment before the heat treatment. The joining surfaces are pre-cleaned. The spinel ceramic is provided with a thin $SiO_2$ layer which is made hydrophilic by a treatment with chemical agents such as nitric acid and an aqueous $NH_4OH:H_2O_2$ solution at elevated temperatures >80° C. After alignment of the samples, the temperature treatment is performed in a high vacuum oven at temperatures between 200 and 400° C. After the heat treatment, an integral bond has formed which makes possible the transparent composite components with RIT values >75%.

EXAMPLE 3

An alkali aluminum silicate glass, which can be pretensioned with pressure in the layer near the surface, is wrung with a transparent spinel ceramic. The dimensions of the square samples are 10 mm×10 mm. The glass has a thickness of 1 mm, and the ceramic thickness is about 200 µm. The evenness is <500 nm, and the roughness is less than 1 nm. Chamfered edges of both joining surfaces allow a precise alignment before the heat treatment. The joining surfaces are plasma cleaned, uncoated and hydrophilic. After alignment of the samples, the heat treatment is performed in a high-vacuum oven at temperatures between 200 and 400° C. After the heat treatment, an integral bond has formed which makes possible the transparent composite components with RIT values >75%.

The invention claimed is:

1. The composite component created by bonding of first and second components, wherein the first component is a transparent technical ceramic having a surface bonded to the second component, the surface of the first component bonded to the second component having an evenness of <10 µm and a roughness $r_a$<20 nm, and the second component comprises a ceramic, a glass, or a plastic, wherein the first and second components are bonded without using a bonding material at a temperature between room temperature and a temperature below a melting/softening temperature of the first component and below a melting/softening temperature of the second component, and wherein the second component is made of a material different from the material of which the first component is made.

2. The composite component according to claim 1, wherein the first and second components are integrally bonded to each other, forming a chemical reaction zone.

3. The composite component according to claim 1, wherein the second component is selected from a ceramic that is a second technical ceramic, a glass which is pretensioned by pressure in a layer near a surface, or a glass that is a hardened glass.

4. The composite component according to claim 1, wherein the transparent technical ceramic has a polycrystalline structure.

5. A composite component created by bonding of first and second components, wherein the first component is a transparent technical ceramic having a surface bonded to the second component, the surface of the first component bonded to the second component having an evenness of <10 µm and a roughness $r_a$<20 nm, and the second component comprises a ceramic, a glass, or a plastic, wherein the first and second components are bonded without using a bonding material at a temperature between room temperature and a temperature below a melting/softening temperature of the first component and below a melting/softening temperature of the second component, and wherein the first component has a thickness <1 mm.

6. The composite component according to claim 1, wherein the transparent technical ceramic comprises Mg—Al spinel ($MgAl_2O_4$) or polycrystalline aluminum oxide ($\alpha$-$Al_2O_3$).

7. The composite component according to claim 1, wherein the composite component is transparent.

8. The composite component according to claim 1, wherein the composite component is transparent and has an RIT >60%, spot frequencies <10%, and haze <10%.

9. A display comprising the composite component according to claim 1.

10. An oven or chimney window display comprising the composite component according to claim 1.

11. The composite component according to claim 5, wherein the first component has a thickness <0.5 mm.

12. The composite component according to claim 5, wherein the first component has a thickness <0.1 mm.

13. The composite component according to claim 5, wherein the first component has a thickness <300 µm.

14. The composite component according to claim 5, wherein the first component has a thickness <200 µm.

15. The composite component according to claim 5, wherein the first component has a thickness <100 µm.

16. The composite component according to claim 1, wherein a surface of the second component bonded to the first component has an evenness of <10 µm.

17. The composite component according to claim 1, wherein the surface of the first component bonded to the second component and a surface of the second component bonded to the first component both have an evenness of <1 µm.

18. The composite component according to claim 1, wherein the surface of the first component bonded to the second component and a surface of the second component bonded to the first component both have an evenness of <100 nm.

19. The composite component according to claim 1, wherein the surface of the first component bonded to the second component and a surface of the second component bonded to the first component both have a roughness $r_a$<20 nm.

20. The composite component according to claim 1, wherein the surface of the first component bonded to the second component and a surface of the second component bonded to the first component both have a roughness ra<10 nm.

21. The composite component according to claim 1, wherein the surface of the first component bonded to the second component and a surface of the second component bonded to the first component both have a roughness ra<1 nm.

22. The composite component according to claim 1, wherein the composite component is transparent and has an RIT >70%, spot frequencies <3%, and haze <5%.

23. The composite component according to claim 1, wherein the composite component is transparent and has an RIT >75%, spot frequencies <1%, and haze <2%.

24. A composite component created by bonding of first and second components, wherein the first component is a transparent technical ceramic having a surface bonded to the second component, the surface of the first component bonded to the second component having an evenness of <10 µm and a roughness $r_a$<20 nm, and the second component comprises a glass, wherein the first and second components are bonded without using a bonding material at a temperature between room temperature and a temperature below a melting/softening temperature of the first component and below a melting/softening temperature of the second component.

25. The composite component according to claim 1, wherein the second component is a glass which is pretensioned by pressure in a layer near a surface or a hardened glass.

\* \* \* \* \*